United States Patent [19]

Apelman

[11] Patent Number: 4,574,278

[45] Date of Patent: Mar. 4, 1986

[54] VIDEO SYNTHESIZER

[75] Inventor: Steven P. Apelman, Long Island, N.Y.

[73] Assignee: Ragen Data Systems, Inc., Central Islip, N.Y.

[21] Appl. No.: 496,192

[22] Filed: May 19, 1983

[51] Int. Cl.$^4$ .............................................. G09G 1/00
[52] U.S. Cl. ..................................... 340/722; 340/721; 324/121 R
[58] Field of Search ............... 340/743, 721, 722, 723, 340/715; 324/121 R

[56] References Cited

U.S. PATENT DOCUMENTS 2,910,681 10/1959 Mita ..................................... 340/743
4,471,348 9/1984 London et al. ................. 324/121 R

OTHER PUBLICATIONS

*Oscilloscope Switch*—Pogson; Electronics, Australia, vol. 43, No. 2, 2/81; pp. 40–47.

Primary Examiner—Marshall M. Curtis
Attorney, Agent, or Firm—Daniel H. Bobis

[57] ABSTRACT

A video synthesizer is adapted for connection to the input circuitry of an oscilloscope, and includes sampling and multiplexing circuitry for presentation of a multiplicity of input signals to a single channel of the oscilloscope. The signals are sampled sequentially, and the samples of respective ones of the signals are multiplexed with corresponding reference voltage levels of a voltage divider so as to vertically displace the signals on the face of the oscilloscope. For periodic input signals, the sequential sampling is repeated at a rate which is not harmonically related to the periodicity of the input signals to fully regenerate the signal waveforms on the oscilloscope. A memory is provided for storing intervals of the input signals in the case of nonperiodic signals, the stored signals then being outputted to the sampling and multiplexing circuitry. By presetting an address counter of the memory, and by selecting a data sampling rate of the memory, the displayed waveforms can be displaced along the x axis of the oscilloscope and expanded to facilitate visual inspection. To provide a maximum rate of sampling, the multiplexing is accomplished with an interlacing of the reference voltages to minimize voltage jumps and reduce the bandwidth of the sample sequence.

31 Claims, 8 Drawing Figures

VIDEO SYNTHESIZER

BACKGROUND OF THE INVENTION

This invention relates to oscilloscopes and, more particularly, to a video synthesizer for combining and sampling a set of input signals to generate a continuous flicker-free presentaton on the oscilloscope of a complete set of the signals.

Oscilloscopes are widely used in the laboratory for examination of electronic signals. Frequently, it is advantageous to simultaneously view a plurality of signals. To meet this need, oscilloscopes have been constructed with two input channels wherein each input channel is to be utilized in viewing a separate input signal. One mode of construction of a dual channel oscilloscope is known as a dual-beam oscilloscope wherein two separate electron beams are directed towards the face of the oscilloscope with the aid of separate beam-deflection circuitry. A second mode of construction of a dual channel oscilloscope is known as a dual-trace oscilloscope wherein the input circuitry for a single electron beam is made to switch alternately between two input terminals of the oscilloscope. With both forms of construction, the dual channel oscilloscope is capable of presenting pictorial representations of electronic signals concurrently on the face of the oscilloscope. With the dual-beam oscilloscope, the two input signals are continuously displayed, one signal being displayed by each of the two beams. With the dual-trace oscilloscope, the pictorial representation is actually a set of alternating sampling intervals of the two signals; however, the rate of alternation between the two sampling intervals is sufficiently high to be above the flicker rate so as to present a flicker-free presentation of the two signals on the face of the oscilloscope.

A problem arises in that there are many situations, particularly in the examination of digital electronic circuits, when it is essential to examine simultaneously the waveforms of many more than just the two signals described above with reference to the dual channel oscilloscope. Obviously, one solution to the problem is to utilize more than one dual-channel oscilloscope. However, this clearly becomes unwieldy and impractical, both in terms of cost and in terms of the space required in the laboratory. Also, the use of separate displays does not permit visual alignment of the various portions of the waveforms of the electronic signals. Ideally, it would be desirable to be able to view many digital waveforms simultaneously on the face of the oscilloscope. However, the foregoing dual-channel oscilloscopes are limited to the display of only two signal waveforms at the same time.

SUMMARY OF THE INVENTION

The foregoing problem is overcome, and other advantages are provided by a video processor which incorporates the invention to provide for the presentation of a set of signals at each input terminal of an oscilloscope. Thus, an oscilloscope having but one input terminal is able, with the help of the invention, to provide a presentation of several and more digital signal waveforms concurrently on the face of the oscilloscope. In the case of a multiple channel oscilloscope, such as the foregoing dual-channel oscilloscopes, the invention provides for the presentation of sets of signals for each input terminal, with all signals being presented relative to a common time base. Thus, in the case of an examination of the waveforms of digital circuitry, all of the waveforms can be simultaneously viewed on the face of the oscilloscope. The simultaneous viewing is provided by offsetting individual ones of the waveforms from each other along the vertical axis of the oscilloscope, this being referred to as the y axis, while the horizontal, or x axis, serves as the time axis in the presentation of the waveforms.

The invention takes advantage of the fact that digital waveforms take either one of two possible values corresponding to the logic states of 0 and 1. The video synthesizer operates by substituting a new value of voltage for each of the two voltage states in each of the input signals. Thus, there is provided a set of voltages equal in number to twice the number of input signals which are to be presented on the oscilloscope. All of these substitute voltage levels are of different values with the result that each input signal waveform is displayed along the y axis of the oscilloscope for the simultaneous presentation of the set of input waveforms. The video synthesizer operates in a sampling mode wherein a switching circuit sequentially couples each of the input signals of a given channel of the oscilloscope via the voltage substitution network to the face of the oscilloscope. Accordingly, the video synthesizer operates as a sampled data system for presentation of a waveform on the oscilloscope as a succession of sample intervals. Each sweep of the x axis of the oscilloscope by the deflection circuitry of the oscilloscope is applied to a different one of the input signals. Both the sweeping rate of the x axis and the sampling rate of the synthesizer are sufficiently rapid so as to provide a flicker-free presentation on the oscilloscope.

As is well-known, in order to present a stationary display of a waveform on the face of an oscilloscope, the waveform must be presented repetitively. In the case of a periodic waveform, such repetition is automatically provided by the successive occurrences of the waveform. In the case of a nonperiodic waveform, additional signal processing is required to provide for a stationary display of the waveform. Accordingly, the invention incorporates a memory, to be referred to as a "snapshot" memory, wherein all signals of the digital circuit which are under examination are simultaneously sampled and stored in the snapshot memory. Thereafter, the output circuitry of the snapshot memory is connected to the sampling circuitry of the video synthesizer for periodically applying the stored signal waveforms via the sampling circuitry to the oscilloscope.

In accordance with yet a further feature of the invention, the snapshot memory is utilized for both the positioning, along the x axis, of the waveforms of the various signals, and for the expansion, along the x axis, of the waveforms of the various signals as may be desired. This feature is particularly useful in allowing a person conducting the testing of the circuitry to view detailed aspects of the various waveforms. The synthesizer provides for a set of differing data rates by which samples of the input signals can be entered into the snapshot memory so as to enable the accummulation of data for both high frequency and low frequency digital signals. In addition, a set of differing data rates is provided for the reading out of data from the snapshot memory so as to obtain the foregoing expansion of the waveforms. A contraction of the presentation of the waveforms is readily accomplished by decreasing the sweep rate on the x axis of the oscilloscope. Also, the initialization of the output addressing of the snapshot memory can be altered to provide for the foregoing positioning of the waveforms on the oscilloscope, the offsetting of the cyclical addressing of the snapshot memory resulting in a repositioning of the waveforms on the display. If desired, a marker signal may also be displayed on the oscilloscope at the conclusion of each outputting of the data from the snapshot memory to alert the viewer of the waveforms to the end of the stored sample intervals. Initiation of the storage of the snapshot memory can be accomplished by a manual signaling of the snapshot memory, or by selection by any desried prescribed arrangement of the waveforms of the respective signals. Also, if desired, any one of the waveforms can be presented on the oscilloscope individually while the other waveforms are suppressed so as to facilitate the study of the selected waveform.

While the invention has been adapted for use with an oscilloscope, it is noted that the video synthesizing features may also be of use to electronic apparatus which processes data, as does an oscilloscope, but which may provide a function other than the display of waveforms, such as the statistical analysis or other processing of a set of input signals. In such situations, the video synthesizer permits a large amount of data relative to a large amount of signals to be accummulated at one time with samples of the data of the various signals being provided over an extended period thereafter during which analysis can be accomplished. In such situations, the video synthesizer may be viewed as a signal processor providing sampling and multiplexing functions as an adjunct to the subsequent signal processing.

BRIEF DESCRIPTION OF THE DRAWINGS

The foregoing aspects and other features of the invention are explained in the following description taken in connection with the accompanying drawings wherein.

DETAILED DESCRIPTION

Figure 1:
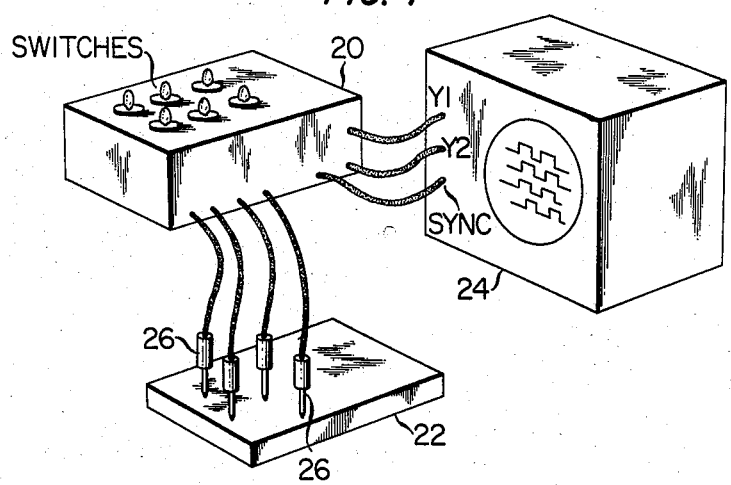
FIG. 1 is a stylized view of the video synthesizer of the invention coupled between an oscilloscope and an electric circuit under examination.

FIG. 1 is a stylized diagrammatic view of a video synthesizer 20 incorporating the invention, the synthesizer 20 being utilized in the examination of an electrical circuit 22 in conjunction with an oscilloscope 24. The electrical signals at several test points of the circuit 22 are being simultaneously examined by probes 26 connecting with the synthesizer 20. By way of example the oscilloscope 24 is a dual-channel type of oscilloscope having two input signal terminals, Y1 and Y2, for the application of electrical voltages which produce vertical deflections on the face of the oscilloscope. Exemplary digital waveforms are portrayed on the oscilloscope 24, the digital waveforms corresponding to the signals observed at the test points of the circuit 22. The oscilloscope 24 is also provided with an external-sync terminal which is coupled to the synthesizer 20 to permit synchronization of the display on the face of the oscilloscope with the set of digital signals. The synthesizer 20 is provided with two output terminals which are coupled respectively to each of the Y input terminals of the oscilloscope 24.

In accordance with a feature of the invention, each output terminal of the synthesizer 20 provides electrical signals for reconstruction of the waveforms of the signals detected by several of the probes 26. In a preferred embodiment of the invention, a total of eight probes are connected to each output terminal via signal conditioning circuitry, as will be described hereinafter, so that the first input channel of the oscilloscope 24 can portray a total of eight waveforms, and also the second input channel of the oscilloscope 24 can portray a total of eight waveforms. In the event that a single-channel oscilloscope were to be utilized, then only one of the output terminals of the synthesizer 20 would be coupled to such oscilloscope and accordingly, a total of only eight waveforms could be displayed on the face of such oscilloscope. The waveforms are reconstructed in accordance with a sampling procedure wherein, for each channel, the eight waveforms are reconstructed piecemeal by repetitive sampling in conjunction with the repetitive scanning of the x axis (the time axis) of the oscilloscope. The rates of sampling and scanning are sufficiently fast so that the resulting traces of the oscilloscope appear to the human eye as solid traces without any flicker.

Figure 2:
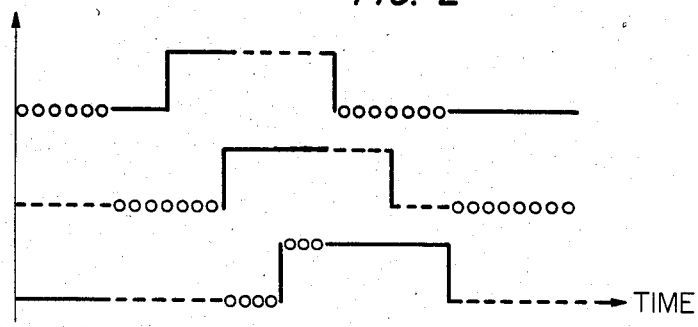
FIG. 2 is a graph of a set of waveforms, showing the sequential construction of portions of the waveforms for display on the oscilloscope of FIG. 1.
Figure 3:
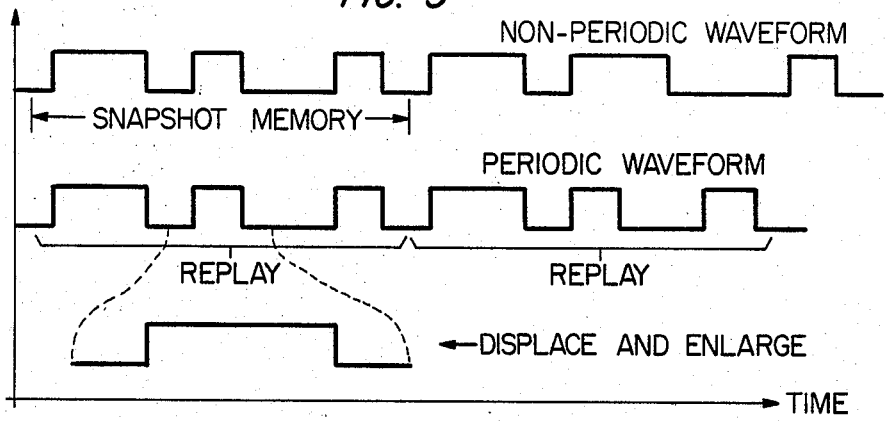
FIG. 3 is a set of graphs showing the conversion of a portion of a non-repetitive waveform to a periodic waveform by use of the snapshot memory of the synthesizer of FIG. 1, FIG. 3 also showing the offsetting and enlargement of a portion of the displayed waveform during replay from the snapshot memory.

The reconstruction can be better understood with reference also to FIGS. 2 and 3 which disclose in further detail the synthesis of the waveforms which are portrayed on the oscilloscope 24. While a total of 16 waveforms can be displayed on a dual-channel oscilloscope, the presentation in FIG. 2 has been simplified to show the synthesis of only three waveforms, the explanation for the three waveforms being equally applicable to the case of the eight waveforms of each oscilloscope channel.

First, it is noted that the three waveforms are digital waveforms, each of which can assume only one of two possible values corresponding to the logic states of 1 and 0. Thereby, the waveforms can be scaled in the vertical direction so as to occupy less than 1/16th of the vertical dimension of the face of the oscilloscope. Such scaling and assignment of the values of the voltage levels for positioning the respective waveforms, one beneath the other, will be described hereinafter. It is noted that the waveforms may be periodic or non-periodic. In the case of the periodic waveform, the synthesis process is greatly simplified in that the waveforms become reconstructed upon successive sequences of the sampling. In the synthesis of the periodic waveforms, it is assumed that the sampling rate is a non-integral multiple of the repetition frequency so as to assure that subsequent sampling intervals do not merely repeat the same portions of the waveforms but, rather, portray successive portions of the waveforms so as to present the complete trace of each waveform. In the case of non-periodic waveforms, the invention provides for the use of a "snapshot" memory which simultaneously stores a succession of samples of all eight waveforms of a single channel, the stored waveforms being outputted repetitively from the memory so as to provide for the set of periodic waveforms which can then be by synthesized upon the face of the oscilloscope by the aforementioned sampling and scanning process.

It should be noted that the synthesis process for the regeneration of eight waveforms is more complex than the sampling and reconstruction of a single waveform, which reconstruction is based on the well known Nyquist criteria which requires that the sampling rate be at least twice as fast as the frequency bandwidth of the signal waveform which is to be presented. In the case of the situation faced by the invention, each waveform may well be near the maximum capability of the oscilloscope in terms of the required bandwidth for portrayal of the waveform. Thus, in the situation where eight waveforms are to be presented for each channel, it is clear that the sampling rate per waveform may well be less than required by the Nyquist criterion. Accordingly, it is understood that the waveforms cannot be reconstructed upon a single sweep along the x axis of the oscilloscope, but, is to be attained only upon a multiplicity of such sweeps. It is for this reason that the invention has relied upon the advantages provided by the periodic waveform in that, by using a sampling rate which is a non-integral multiple of the waveform repetition frequency, different portions of each waveform can be portrayed during each of the succession of sweeps. The persistence of the phosphors of the oscilloscope face, or, alternatively the persistence of the human eye, integrates the successive sections of the waveform to produce a flicker-free presentation of the waveform.

In the portrayal of the three waveforms of FIG. 2, each trace is constructed of solid lines, dashed lines, and little circles. The solid lines show portions of the waveforms which are produced on the oscilloscope 24 after a first set of sampling passes have been made through each of the respective waveforms. The solid lines are retained during several further sampling passes by the persistence of the phosphor or by the persistence of the human eye viewing the oscilloscope display. Subsequent stages of the sampling process are portrayed by the dashed traces which show further construction of the waveforms from subsequent sampling passes, the circles showing further construction obtained by yet a further sampling pass through the respective waveforms.

More specifically, upon examination of the three waveforms of FIG. 2, it is noted that the three waveforms are of the same form and represent the situation wherein a waveform appears in a digital circuit at three different locations at three different times, each occurrence being delayed from the previous occurrence. The leading edge of the pulse of the first waveform is formed of a solid trace. At the conclusion of the solid trace, the sampling stage passes onto the next waveform to provide both the beginning and middle portions of the pulse of the second waveform. At the conclusion of the solid trace of the second waveform, the sampling stage continues by passing to the third waveform wherein the solid trace appears at the middle and latter portion of the pulse of the third waveform.

Since the waveforms are assumed to be periodic in the example of FIG. 2, the waveforms may be regarded as being stationary in time with reference to their portrayal on the face of the oscilloscope. A subsequent sampling pass through the waveforms may partially overlap a previous pass, the amount of overlap depending on the respective rates of the sampling of the waveform periodicity. The dashed traces are presented by way of example to illustrate the resultant contributions to the waveforms resulting from a sampling pass during a subsequent period of the waveforms. And, similarly, the traces of the circles represent a further stage of the sampling occurring during a further period of the waveforms.

The first two graphs in the set of graphs of FIG. 3 demonstrate the creation of a periodic waveform from a section of a non-repetitive waveform by use of the snapshot memory. A portion of the non-repetitive waveform (the first graph of FIG. 3) is stored in the snapshot memory and then is outputted repetitively from the memory (second graph of FIG. 3) to produce a periodic waveform. The information portrayed in the periodic waveform is dependent on the specific interval of the non-repetitive waveform which has been stored in the memory. By use of the periodic waveform of FIG. 3, it is possible to utilize the previously described equipment of the invention for portrayal of a portion of a non-repetitive waveform upon the face of the oscilloscope 24.

In the third graph of FIG. 3 there is presented a further feature of the invention which utilizes the snapshot memory to offset and enlarge a specific portion of the waveform (second graph) which is replayed at regular intervals to provide the periodic waveform. The offsetting is accomplished by presetting the address of the memory, as will be described hereinafter, so as to alter the temporal relationship between the cyclical addressing of the memory and the synchronization of the oscilloscope. The enlargement of the second pulse of the periodic waveform is accomplished by altering the clocking rate by which data is outputted from the snapshot memory.

Figure 4:
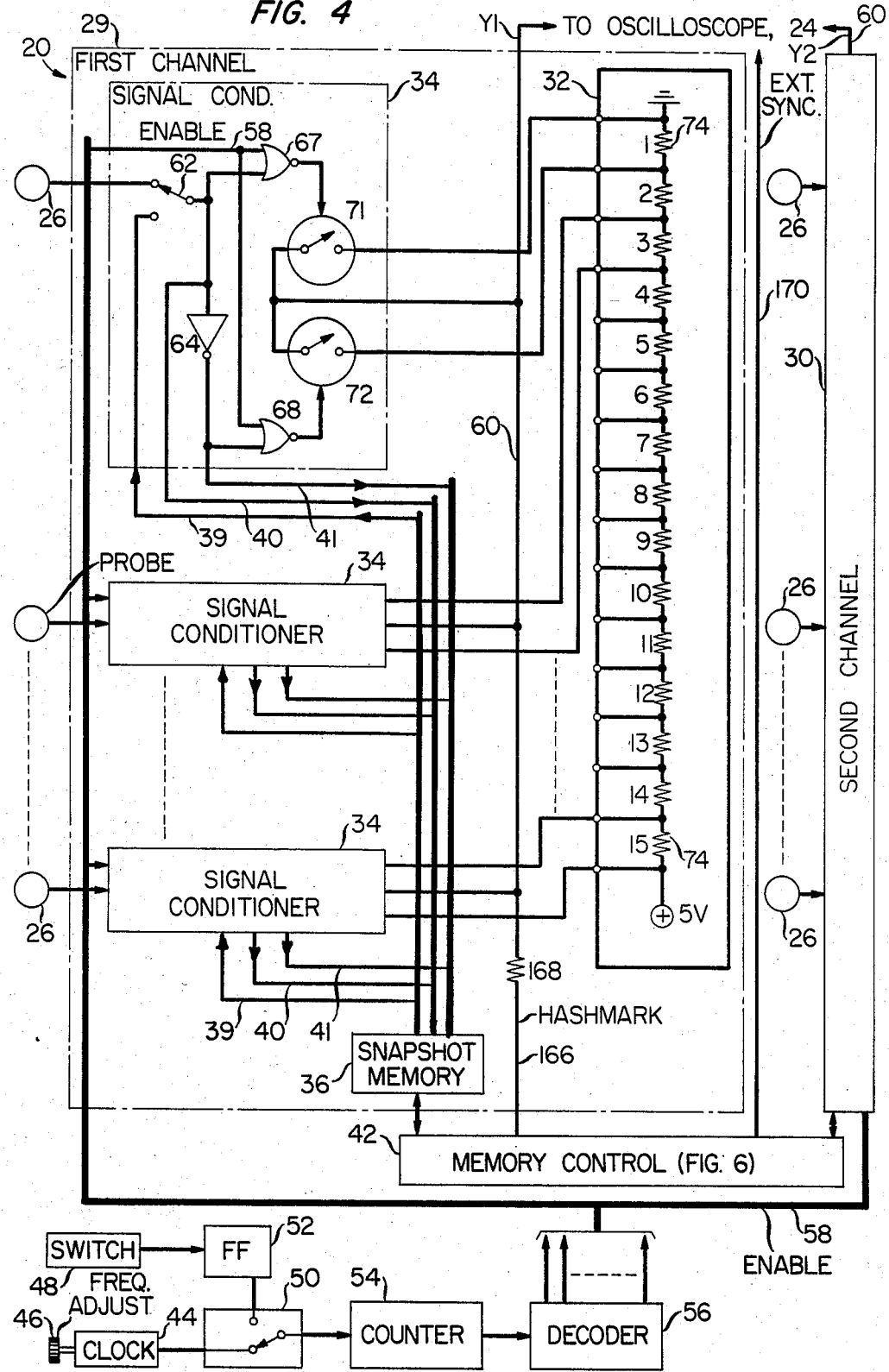
FIG. 4 is a block diagram of the synthesizer showing a pair of channels for the multiplexing of signals from a set of probes, the figure further showing control circuitry utilized in operating the channels of the synthesizer.

FIG. 4 shows a block diagram of the video synthesizer 20. The synthesizer 20 is formed of two channels 29–30 which are of identical construction, each channel receiving signals from individual ones of the probes 26. Each of the channels 29–30 includes a voltage divider 32 and a set of signal conditioning units 34 which are coupled between respective ones of the probes 26 and corresponding pairs of terminals of the divider 32. Also included within each of the channels 29–30 is a snapshot memory 36 which is coupled via individual sets of lines to each of the conditioning units 34. In the connection of the snapshot memory 36 to each of the conditioning units 34, the set of lines includes an output line 39 for feeding data out of the memory 36 into the conditioning unit 34, a sense line 40 for signalling the memory 36 as to the logic states of an output signal of the probe 26, and an input line 41 for feeding data into the memory 36 from a conditioning unit 34.

The synthesizer 20 further comprises a memory control 42 for controlling the memories 36, a clock 44 having a knob 46 permitting manual selection of the repetition frequency of clock pulses by the clock 44, switches 48 and 50 and a decoder 56. The switch 48 provides either high or low voltages, corresponding to logic states of 1 or 0, to the flip-flop 52 so that manual actuation of the switch 48 sets the flip-flop 52 while deactuation of the switch 48 resets the flip-flop 52. Thereby, the flip-flop 52 serves as a "debouncer" to provide a single electrical pulse to a terminal of the switch 50 upon a momentary actuation of the switch 48. Thereby, the switch 50 can selectively couple pulses from either the clock 44 or the flip-flop 52 to the counter 54. In the preferred embodiment of the invention, there is a total of eight conditioning units 34 in each of the channels 29-30, only three of the conditioning units 34 being shown in the drawing to facilitate the description of the invention. As the counter 54 counts the pulses applied thereto by the switch 50, the counter 54 cylces through a set of eight output counts and then recycles to the first count of the set. The eight counts correspond to the eight conditioning units 34 in each of the channels 29-30. The output counts of the counter 54 are coupled to the decoder 56 which activates corresponding ones of the enable lines 58 which connect with corresponding ones of the conditioning units 34 for enabling the respective ones of the conditioning units 34 o couple a signal sample from a probe via an output line 60 to an input terminal of the oscilloscope 24.

Each conditioning unit 34 comprises a manually operable switch 62, a digital inverter 64, two NOR gates 67-68, and two electronically operable analog switches 71-72. One input terminal of the switch 62 connects with a probe 26, a second input terminal of the switch 62 connects with the data line 39 from he memory 36, and the output terminal of the switch 62 connects with the sense line 40 and also with input terminals of the inverter 64 and each of the NOR gates 67-68. The output terminal of the inverter 64 connects with the data line 41 providing data to the memory 36, the output terminal of the inverter 64 also being connected to an input terminal of the NOR gate 68. An enable line 58 from the decoder 56 connects with an input terminal in each of the NOR gates 67-68. The output terminal of the NOR gate 67 provides an electrical signal which operates the switch 71 to provide a switch closure. The output terminal of the NOR gate 68 provides an electrical signal which operates the switch 72 to provide a switch closure.

In operation, the NOR gates 67-68 are enabled by a logic-0 signal on the line 58 which represents the complemented enable signal. Such enabling occurs only upon activation of the decoder 56 in the selection of a specific one of the conditioning units 34. The logic state of the signal received by the probe 26 is applied via the switch 62 directly to the NOR gate 67, but is inverted to the opposite logic state by the inverter 64 upon application to the NOR gate 68. Thus, irrespectively of which logic state is received from the probe 26, one or the other of the NOR gates 67-68 is activated by a logic-0 signal. More particularly, the switch 71 is closed in response to the appearance of a logic-0 signal at the switch 62, and the switch 72 is closed upon the appearance of a logic-1 signal at the switch 62. The switches 71-72 couple specific values of voltage from terminals of the voltage divider 32 to the output line 60 in each of the channels 29-30, the voltage coupled via the switch 71 being of a lower value than the voltage coupled via the switch 72. As will be described hereinafter, the difference in voltage is 0.3125 volts out of a total of 5 volts which is available for the simultaneous display of eight waveforms. The foregoing difference in voltage provided by the switches 71-72 corresponds to the difference in voltage between a logic-1 signal and a logic-0 signal applied to a Y input terminal of the oscilloscope.

It is noted that the switch 62 can be in either of two positions. When coupled as shown in the drawing, the signals of probes 26 are coupled to the NOR gates 67-68. When the switch 62 is operated to the alternate position for connection with the line 39, data is outputted from the snapshot memory 36 into the NOR gates 67-68. Thereby, the NOR gates 67-68 and the switches 71-72 can be responsive either to signals presented directly from a probe 26, or from signals which have been previously stored in the snapshot memory 36.

Figure 5:
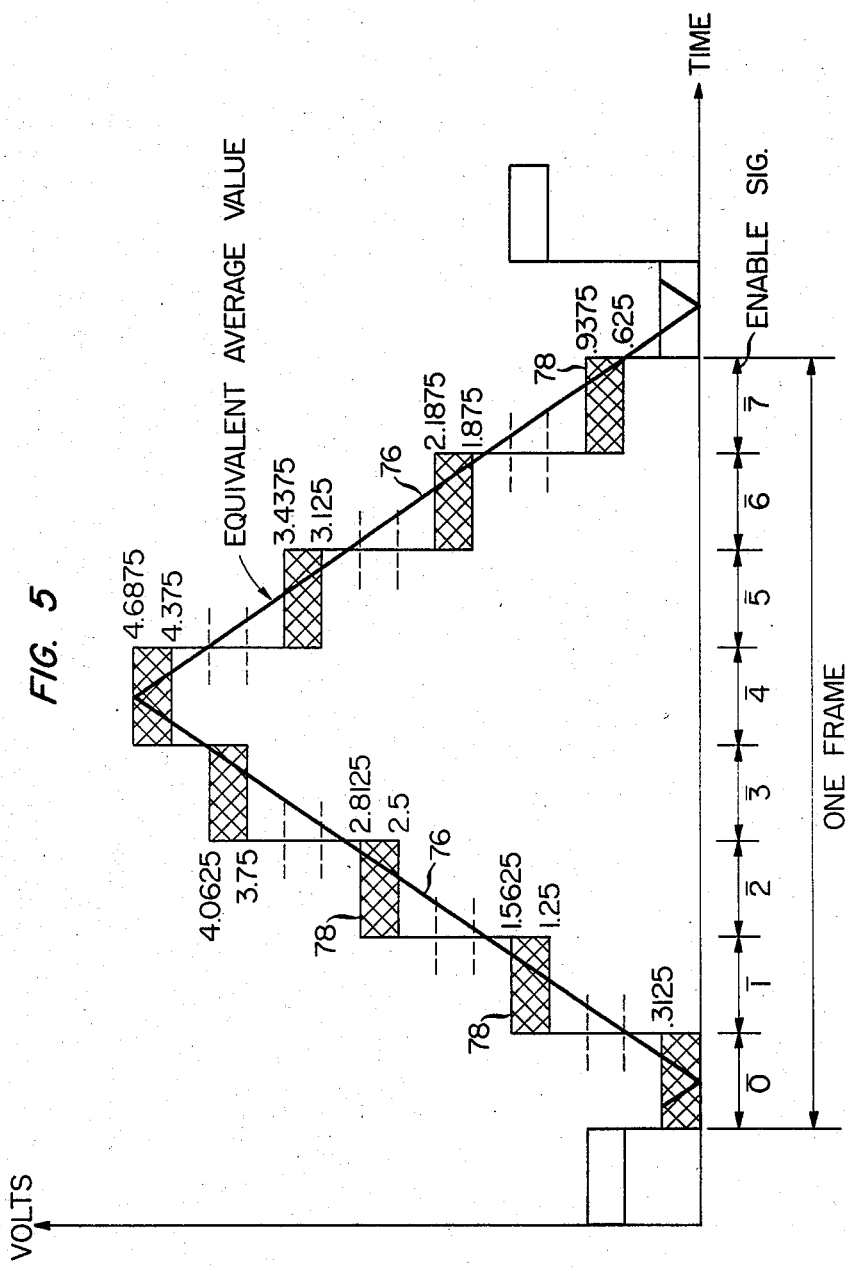
FIG. 5 is a graph disclosing the interleaving of voltage levels in the sampling and multiplexing operation.

With reference also to FIG. 5, the operation of the decoder 56 may be further understood in the selection of individual ones of the conditioning units 34 during the repetitive sequences of enablement of the respective ones of the conditioning units 34. The voltage divider 32 (FIG. 4) comprises a set of serially connected resistors 74 which are of identical value in the preferred embodiment of the invention. The divider 32 comprises 15 of the resistors 74, the series arrangement being coupled between 5 volts and ground. Thus, the increment in voltage across each of the resistors 74 is 0.3125 volts. The first resistor, the third resistor and the remaining ones of the odd-numbered resistors 74 provide the difference in potential between a logic 1 and a logic 0. The second resistor, the fourth and the remaining ones of the even-numbered resistors provide voltage drops which are equal to the spacing between waveforms along the vertical axis of the oscilloscope 24. Since all of the resistors 74 are of equal value, the spacing between the waveforms is equal to the difference in value between the logic 1 and the logic 0 states. In the event that even-numbered resistors would be of greater value than the odd-numbered resistors, then the spacing between the waveforms would be greater than the difference in value between the logic 1 and the logic 0 states. As portrayed in FIG. 4, the terminals of the first resistor 74 connect with the first one of the conditioning units 34, and the terminals across the third resistor are connected to the second of the conditioning unit 34, the arrangement continuing with the terminals of the 15th resistor being connected to the last, the eight, one of the conditioning units 34.

The voltages measured between ground and the respective terminals of the voltage divider 32 are portrayed in FIG. 4, and are also set forth adjacent the steps in the waveform of FIG. 5. The solid trace 76 (FIG. 5) represents a linearized approximation to the scanning voltage applied periodically as the y axis of the oscilloscope 24, the trace 76 being periodic with portions thereof being time-shared among the probes 26 in a set of eight of the probes 26. Thereby, the waveform associated with each of the eight probes 26 is set forth on the face of the oscilloscope 24 at a different vertical position. The trace 76, thus shows, a succession of sampling passes made by the synthesizer 20 for regenerating each of the waveforms as has been described with reference to FIG. 2.

The actual sampling is described by the set of steps 78 of FIG. 5. Each step corresponds to an address of an enable line 58 provided by the decoder 56 of FIG. 4. Each step 78 has an upper tier and a lower tier corresponding to the two possible values of voltage which are coupled via a conditioning unit 34 to the output line 60 of FIG. 4. As has been noted above, the voltages appended adjacent the tiers of the steps 78 correspond to those appended adjacent the resistors of the divider 32. Thus, the step-wise graph of FIG. 5 portrays each possible value of voltage which may be coupled by the line 60 from one of the channels 29–30 of the synthesizer 20 to a vertical input terminal of the oscilloscope 24. The graph of FIG. 5 shows values of voltage as a function of time, these values of voltage appearing on the line 60. In particular, it is noted that the successive values of voltages of the respective steps 78 are staggered or inerleaved rather than monotonically increasing so as to avoid any large jumps in the value of voltage from one step 78 to another of the steps 78 throughout the periodic sampling process. In particular, it is noted that by way of contrast, in the event that each of the conditioning units 34 were to be enabled sequentially in accordance with increasing values of voltages of the divider 32, then a large voltage jump would occur at the beginning of each sampling period. In view of electrical capacitance which is always present on connecting leads such as the connection of the line 60 to a Y input terminal of the oscilloscope 24, a large jump in voltage would necessitate a correspondingly large amount of current and power in order to counteract the effect of the capacitance. By minimizing the jumps between successive ones of the steps 78, the power requirements are greatly reduced. In addition, the bandwidth of the overall sampling waveform, as depicted in FIG. 5, is greatly reduced by providing for the stepwise sampling waveform which follows the solid trace 76. Such a bandwidth is considerably reduced form that which would be present if, for example, a monotonically increasing sampling voltage were employed with the above-noted large jump at the beginning of each sampling pass.

The period of the sampling waveform of FIG. 5, and the rate of sampling from step to step is controlled by the block 44 of FIG. 4. As has been noted hereinabove with reference to the explanation of FIG. 2, it is important that the periodicity of the sampling passes occur at a repetition frequency which is not harmonically related to the periodicity of the set of waveforms being sensed by the probes 26. Thus, a wide range of sampling rates can be employed subject to the proviso that the harmonically related rates be avoided. Accordingly, the person utilizing the synthesizer 20 and the oscilloscope 4 for examination of the electrical circuit 22 (FIG. 1) adjusts the knob 46 of the clock 44 to select a clock frequency which clocks the counter 54 and the decoder 56 at a rate in accordance with the foregoing proviso. Thereby, the person is assured of a complete synthesis of all eight waveforms being processed by either one of the channels 29–30 of the synthesizer 20.

Should the person testing the circuit 22 desire to view only one waveform from one of the probes 26 at a time, he operates the switch 50 (FIG. 4) to couple the flip-flop 52 to the counter 54. He then steps the counter 54 one pulse at a time, by operation of the switch 48, until the count of the counter 54 corresponds to the desired waveform. For example, if the person wishes to examine the fourth waveform, he must advance the counter 54 by six steps, as shown in FIG. 5, due to the interleaving of the voltage levels. This assuming that the counter 54 was at some other value of count, then the person would have to operate the switch 48 more or less times accordingly to activate the appropriate one of the enable lines 58 of the decoder 56 to couple the signal from the desired one of the probes 26 to the oscilloscope 24.

Figure 6:
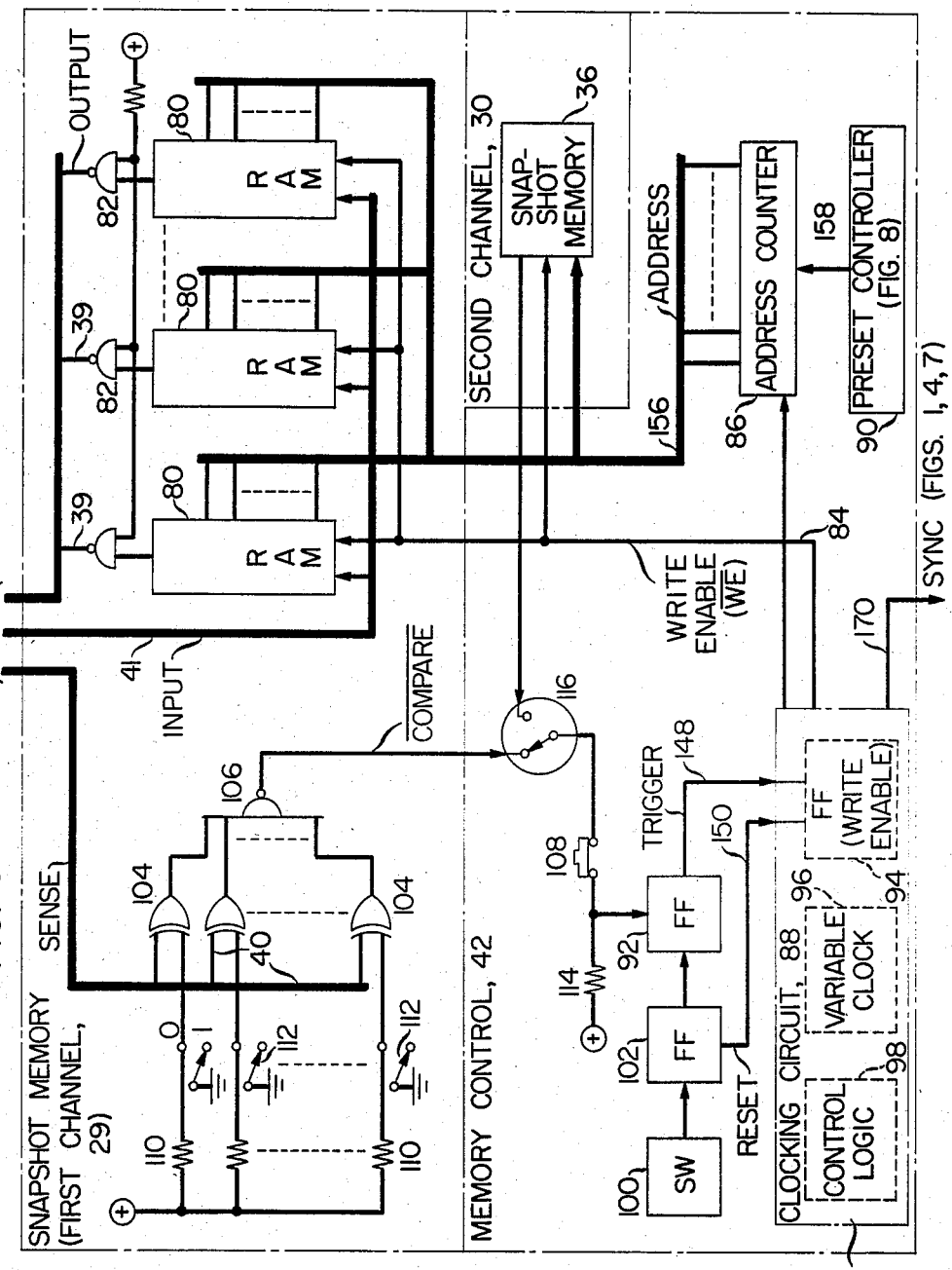
FIG. 6 is a block diagram of control circuitry for use in operation of the snapshot memory of FIG. 4.

With reference now to FIG. 6, there are shown the memory control 42 and snapshot memory 36 of FIG. 4. The memory 36 comprises a set of storage units in the form of RAMs 80 (random-access memories) having data-output terminals coupled via NAND gates 82 to respective ones of the output lines 39 (FIG. 4), the data-input terminals of the RAMs 80 being connected to respective ones of the input lines 41. A write-enable signal is supplied via line 84 simultaneously to each of the RAMs 80, the complemented value commanding the writing-in of new data while the alternate logic state on line 84 permits the reading-out of data from the RAMs 80. The RAMs 80 are addressed by a counter 86 of the control 42.

The control 42 further comprises a clocking circuit 88 for providing clock pulses to the counter 86, a controller 90 for presetting the count of the address counter 86, and a flip-flop 92 for triggering the clocking circuit 88. The clocking circuit 88 includes a flip-flop 94, a variable clock 96 and a control logic unit 98 as will be described more fully in FIG. 7. The flip-flop 92 may be activated manually by means of a switch 100 coupled via a flip-flop 102 to the flip-flop 92. The flip-flop 102 serves as a "debouncer" for providing a well defined pulse to the flip-flop 92 in the event of the presence of bounce at the switch 100 as it is manually operated. Alternatively, the flip-flop 92 can be automatically activated by means of signals from the sense lines 40 (FIG. 4) which are coupled via exclusive-OR gates 104, a NAND gate 106 and a manually-operated switch 108. A logic-1 voltage is coupled via resistors 110 and switches 112 to one input terminal in each of the exclusive-OR gates 104. The switches 112 are manually operable for converting the logic-1 voltage to a logic-0 voltage by grounding the terminal of the resistor 110 connecting with the gate 104. A logic 1 voltage is also coupled via a resistor 114 to the junction of the switch 108 and the flip-flop 92.

In operation, data received from the probes 26 (FIG. 4) is entered into the RAMs 80 by triggering the clocking circuit 88 to complement the write-enable signal on line 84 and to apply clock pulses to the address 86. Upon cycling through the entire set of addresses of the RAMs 80, the clocking circuit restores the logic-1 state on line 84 so that data can be read out of the RAMs 80. When it is desired to transfer data from the RAMs 80 via the conditioning units 34 (FIG. 4) to the oscilloscope 24, the switches 62 are operated to connect the NOR gates 67–68 to the lines 39. The clocking circuit 88 then continually clocks the address counter 86 for the cyclical reading-out of data from the RAMs 80 to the oscilloscope 24.

For the automatic actuation of the flip-flop 92 in the triggering of the clocking circuit 88, the switch 108 is operated to couple the NAND gate 106 to the flip-flop 92. The switches 112 are manually operated to provide a set of reference logic signals to the gates 104, against which signals the logic states of the probe signals are compared by communicating the probe signals via the lines 40 to the exclusive-OR gates 104. When an equality is attained among the set of signals provided by the switches 112 and the set of signals provided by the lines 40, the gates 104 output logic-1 signals which activate the NAND gate 106 to apply a logic-0 signal to the flip-flop 92, thereby actuating the flip-flop 92. In this way, the entry of data into the snapshot memory 36 can be initiated on the occurrence of a precisely defined set of logic states among the signals being examined by the probes 26. A selector switch 116 connects between the NAND gate 106 and the switch 108 for alternatively coupling the corresponding circuitry of the snapshot memory 36 of the second channel 30 of the synthesizer 20 in the event that initiation of the storage operation is to be based on the signals received by the probes 26 of the second channel. Similarly, the write-enable signal on line 84 as well as the addresses on bus 118 also connect from the memory control 42 to the RAMs 80 of the second channel 30. Thereby, the reading and writing control of the snapshot memories 36 are controlled by the common memory control 42, with actuation of the writing mode being alternately selectable between the probes of the two channels.

Figure 7:
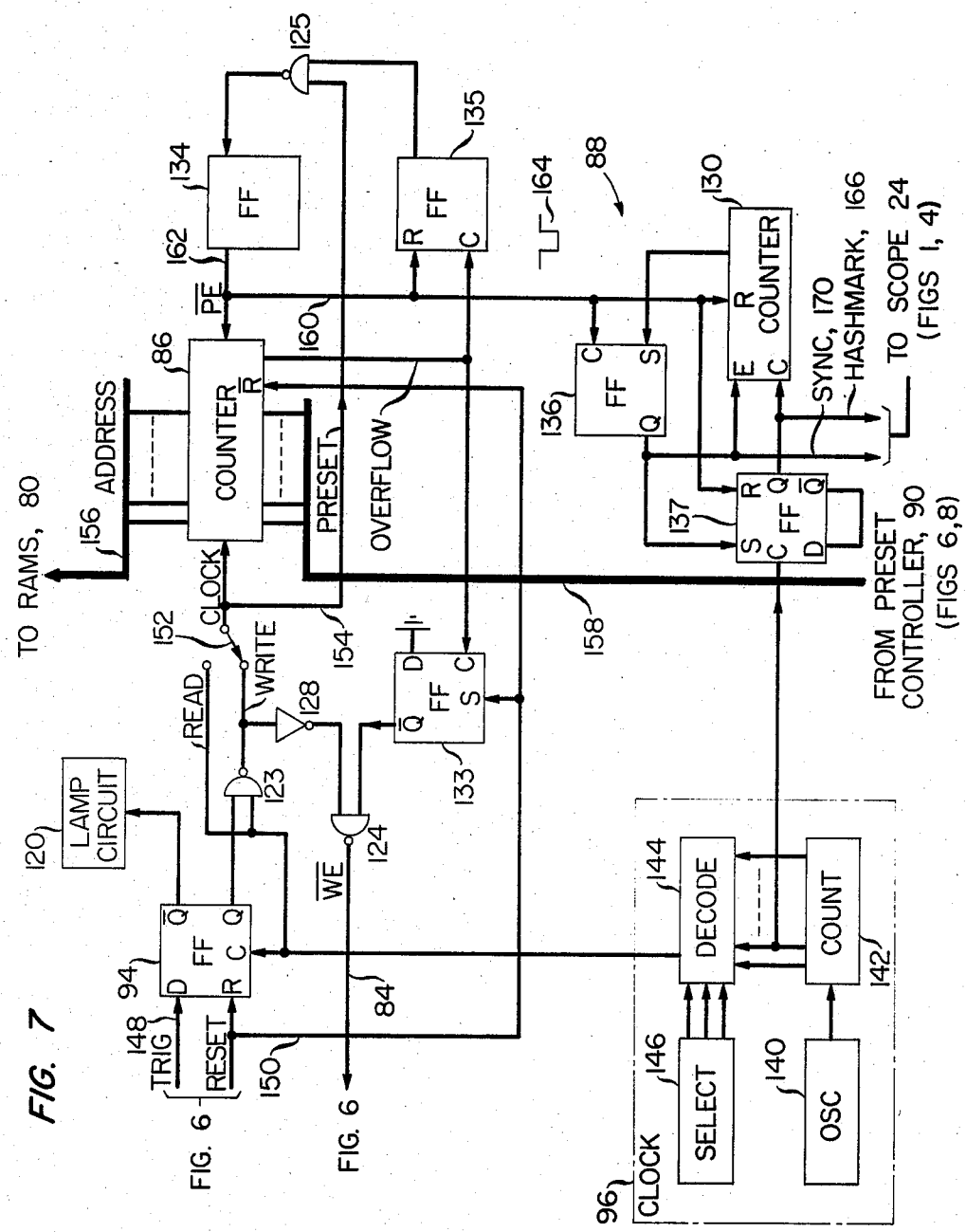
FIG. 7 is a block diagram of a clocking circuit utilized in the operation of an address counter of FIG. 6.

With reference also to FIG. 7, there is provided a more detailed description of the circuitry of the memory control 42 of FIG. 6. FIG. 7 shows diagrammatically the components of the clocking circuit 88 and its interconnecting with the address counter 86. FIG. 7 includes the flip-flop 94 and the clock 96, the remaining components comprising the control logic 98. The circuit 88 further comprises a lamp circuit 120, three NAND gates 123-125, a digital inverter 128, a counter 130, and five flip-flops 133-137. The clock 96 comprises an oscillator 140, a counter 142, a decoder 144, and a selector 146.

In operation, the flip-flop 94 is triggered by the flip-flop 92 (FIG. 6) via line 148. The flip-flop 94 is reset by the flip-flop 102 (FIG. 6) via line 150. The reset line 150 also connects with the flip-flop 133 and the counter 86. The flip-flop 94 is clocked by the clock 96. The clock signal is also applied to an input terminal of the NAND gate 123 and, via a switch 152 to the counter 86. The NAND gate 123 is activated by the flip-flop 94 to pass clock pulses via the switch 152 to the counter 86. The clock pulses are also coupled by the NAND gate 123 via the inverter 128 to an input terminal of the NAND gate 124, the NAND gate 124 being activated by the flip-flop 133 to present the clock pulses on the line 84 as the write-enable signal which has been previously described with reference to FIG. 6. With respect to the activation of the NAND gate 123 by the flip-flop 94, the flip-flop 94 is a type D flip-flop and, accordingly, the logic state of the trigger on line 148 is coupled from the D input terminal to the output terminal and to the NAND gate 123 upon the clocking of the flip-flop 94 by the clock 96.

The clock 96 provides clock pulses at any one of a set of clock rates, the clock rate being selected manually by operation of the selector 146. The counter 142 counts pulses provided by the oscillator 140. The output lines from the individual stages of the counter 142 are coupled to the decoder 144. The decoder 144 then couples one of the output lines of the counter 142 to the output terminal of the clock 96 and to the flip-flop 94. Since the repetition frequencies of the pulses on the output lines of the counter 142 are in multiples of 2, the set of clock rates provided by the clock 96 are also in multiples of 2. A 3-bit code word is applied by the selector 146 to opearte the decoder 144. Typically, the selector 146 includes a set of resistors (not shown) for coupling logic-1 voltages to the decoder 144, the selector 146 also including a set of switches (not shown) which are connected for individually grounding selected ones of the resistors to provide logic-0 signals as is well known in the art. Thereby, a person utilizing the video synthesizer 20 is able to vary the clock rate of the clock 96 as may be desired to provide the requisite rate of sampling and input signal to the synthesizer 20 and for reading out stored signals from the RAMs 80 (FIG. 6).

The counter 86 counts the clock pulses on line 154 from the switch 152 and, in response to the counting, provides an output address on line 156 to the RAMs 80 (FIG. 6). Upon reaching the maximum count, the counter 86 overflows and returns to the count of the preset value to which the counter 86 has been preset by the digital word on line 158 from the controller 90 (FIG. 6). The counter overflow signal is coupled via line 160 to the clock-input terminals of the flip-flops 133 and 135. The recycling of the counter 86 from its maximum count back to the preset count is accomplished with the aid of a preset-enable signal on line 162, which signal is provided by the flip-flops 134-135 and the NAND gate 125.

The application of the overflow signal to the flip-flops 135 and 133 provides the dual functions of generating the preset-enable signal on line 162 and the clocking of the flip-flop 133 to terminate the write-enable signal on line 84. The preset-enable is accomplished as follows. Upon the clocking of the flip-flop 135 by the overflow signal, the flip-flop 135 enables the NAND gate 125 to pass a clock pulse from line 154 to trigger the flip-flop 134. Upon being triggered, the flip-flop 134 produces the preset-enable signal which is coupled via line 162 to the counter 86, the flip-flop 135, the flip-flops 136-137, and he counter 130. Upon the appearance of the preset-enable signal on line 162, he flip-flop 135 is reset, thereby terminating further passage of clock pulses from line 154 via the NAND gate 125 to the flip-flop 134. Upon deactivation of the NAND gate 125, the flip-flop 134 is reset, thus terminating the preset-enable signal. Thus, the signal on line 162 is a pulse as depicted at 164.

With respect to the use of the flip-flop 133 in the generation of the write-enable signal on line 84, the flip-flop 133 is initially set at the time of resetting of the flip-flop 94. During the set condition, the flip-flop 133 outputs a signal which disables the NAND gate 124. At the next overflow signal on line 160, the flip-flop 133 is clocked to apply an enable signal to the NAND gate 124. Thereupon, with the return of the counter 86 to the preset value, a succession of clock pulses is coupled via the NAND gate 123, the inverter 128 and the NAND gate 124 to appear as the write-enable signal on line 84.

The succession of pulses on line 84 thus continues in synchronism with the advancement of the count of the counter 86 so that the enablement of data entry into the snapshot memory 36 is synchronized with the addressing of the memory 36 by the counter 86.

The foregoing relationship between the data entry and the presetting of the counter 86 permits the introduction of a further feature of the invention, to be described in greater detail hereinafter, wherein, during readout of data from the snapshot memory 36, the preset word on line 158 may be altered so that the counter 86 presets to a larger or a smaller value of count. The result of such alternation in the preset value is a sidewise displacement of the traces of the waveforms on the oscilloscope 24 (FIG. 1) such displacement greatly facilitates observation of a specific part of a waveform which may be of interest. The waveform can also be expanded by increasing the sweep speed and the x axis of the oscilloscope 24 or, alternatively, by decreasing the rate of the clock 96 during readout of data from the snapshot memory 36. The expansion of the waveform provides still further opportunity for examination of a point of interest on the displayed waveforms.

The switch 152 is manually operated for applying clock pulses to the counter 86 directly from the clock 96 during readout of data from the snapshot memory 36. During the entry of data into the snapshot memory, the switch 152 is placed in the alternate position for the coupling of clock pulses from the NAND gate 123 to the counter 86.

A further feature of the invention is the utilization of the lamp circuit 120, which circuit is activated by the flip-flop 94 upon the triggering of the flip-flop 94 by either the switch 100 or the switch 108 (FIG. 6). In particular, it is noted that, with the automatic triggering mode provided by the comparison of the logic signals of the lines 40 (FIG. 6) with the reference set of logic signals, should the referenced pattern fail to materialize either because of a failure in the circuit 22 (FIG. 1) under test or by an incorrect selection with the switches 112 (FIG. 6), then the lamp circuit 120 will show no indication of triggering. Thereby, a person utilizing the synthesizer 20 is alerted to the fact that there has been no entry of data into the snapshot memory 36. When proper remedial action is taken resulting in the triggering of the flip-flop 94, the person using the synthesizer 20 is alerted by an illumination signal of the lamp circuit 120 that data is being stored in the snapshot memory 36.

With respect to the presentation of a display of waveforms on the oscilloscope 24 by the repetitive outputting of stored data of the snapshot memory 36, it is noted that the X-axis circuitry of the oscilloscope 24 may be set for a sweep time which is equal to one period in the cyclical readout of data from the memory 36. Alternatively, the x-axis sweep may be made longer than one period, for example, two or three periods of the cyclical readout. In order to alert a person using the synthesizer that more than one period of the cyclical readout is being presented, the circuitry of FIG. 7 provides a "hash" mark on line 166 (FIGS. 4 and 7) which is summed by a resistor 168 with the signals of the divider 32 (FIG. 4) and is coupled by the line 60 to a Y-input terminal of the oscilloscope 24. The circuitry of FIG. 7 also provides a synchronization signal on line 170 (FIGS. 1, 4, 6 and 7) which is applied to the external-sync terminal of the oscilloscope 24 to stabilize the presentation on the oscilloscope and to maintain the presentation in synchronism with the readout of data from the snapshot memory 36.

The generation of the sync signal on line 170 and the hash mark on line 166 is accomplished as follows. Upon the completion of each cycle of outputting of data from the memory 36, the counter 86 overflows, as has been noted above, with the resultant production of the preset-enable signal on line 162. The preset-enable signal triggers the flip-flop 136 to provide an output pulse signal on line 170, which signal is the foregoing synchronization signal. The signal on line 170 also sets the flip-flop 137 to permit passage of clock pulses therethrough from a single output stage of the counter 142 to the line 166, the squarewave signal provided by the counter 142 and the flip-flop 137 producing a rising and falling waveform on the oscilloscope 24 which serves as a hash mark. Since the occurrence with the sync signal, and since the sync signal occurs concurrently with the completion of a readout interval of the memory 36, the hash mark on line 166 serves to identify the completion of one readout interval and the beginning of a second readout interval.

The flip-flop 137 is of type-D construction with an output terminal being connected to the D input terminal. Thereby, during the application of the signal from the counter 142 to the clock input terminal of the flip-flop 137, the line 166 receives the signal from the D input terminal. Between clock pulses of the counter 142, the signal on line 170 sets the flip-flop 137 back to its original state with a corresponding logic level appearing on line 166. The signal on line 170 also enables the counter 130 to count the pulses appearing on the line 166. The counter 130 counts a predetermined number (for example a count of eight) and then outputs a pulse which sets the flip-flop 136 to terminate the signal on line 170. Concurrently, the setting of the flip-flop 137 is discontinued and there is no further flow of clock pulses from the counter 142 via the flip-flop 137 to the line 166. Thereby, the hash mark is completed.

In the generation of the hash mark on line 166, the frequency of the modulations is independent on the section of the counter 142 which is coupled to the flip-flop 137. By taking a high frequency section, such as the least significant bit or the following section, a high frequency modulation is provided, the high frequency modulation being preferred. The coupling of a low frequency section, such as the most significant bit, of the counter 142 to the flip-flop 137 would introduce an excessively long period of operation of the counter 130 which, in combination with the slow clock rate might interfere with the presentation of the waveforms on the display of the oscilloscope 24.

Figure 8:
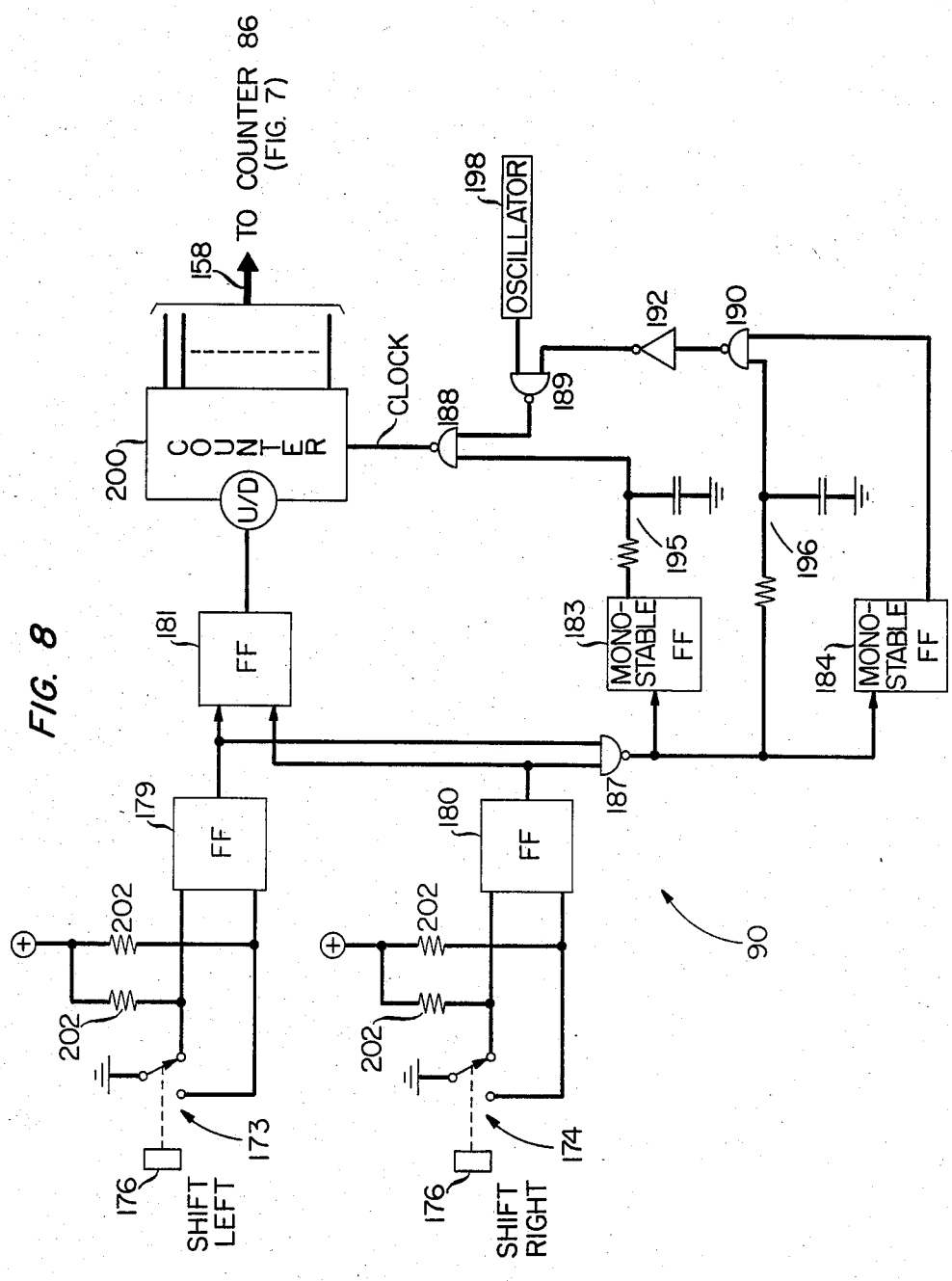
FIG. 8 is a block diagram of a circuit utilized in presetting the address counter of FIGS. 6 and 7 to provide for an offsetting of the display of waveforms on the oscilloscope.

FIG. 8 shows a block diagram of the preset controller 90 which has been referred to in FIGS. 6 and 7. The controller 90 comprises two switches 173-174 having push-buttons 176, three set-reset flip-flops 179-181, two monostable flip-flops 183-184, four NAND gates 187-190, a digital inverter 192, two holding circuits 195-196, an oscillator 198 and a counter 200. The output lines of the counter 200 fan into the line 158 to provide the preset count for the presetting of the counter 86 (FIG. 7). The switch 173 is used for decreasing the preset count so as to shift the waveforms of the oscilloscope to the left. The switch 174 is used for increasing the preset count so as to shift the waveforms of the oscilloscope display to the right. Each of the switches 173 and 174 is operated only momentarily during the presence of finger pressure on a push-button 176 by the person using the synthesizer 20.

In operation, the input terminals of the flip-flops 179-180 are supplied with logic-1 signals from a supply of voltage by resistors 202. The output terminals of the switches 173-174 connect with the input terminals respectively of the flip-flops 179-180. Operation of the switches 173-174 serves to ground either one input terminal or the other input terminal in each of the respective flip-flops 179-180, the grounding introducing a logic-0 to an input terminal. Each of the switches 173-174 has two positions respectively for setting and resetting the corresponding ones of the flip-flops 179-180.

The output terminals of the flip-flops 179-180 are coupled to input terminals of the NAND gate 187 and to the input terminals of the flip-flop 181. The output terminal of the flip-flop 181 is applied to the up/down control terminal of the counter 200. The logic state of the output signal of the flip-flop 181 determines whether the counter 200 counts up or down. Alternate actuation of the flip-flops 179–180 results in an alternate setting and resetting of the flip-flop 181 with a corresponding alternation in the command to count up or down. Thereby, successive operations of the switch 173 result in a decrementing of the count of the counter 200 while successive operation of the switch 174 result in an incrementing of the count of the counter 200.

When neither one of the push-buttons 176 is depressed, both of the flip-flops 179–180 are in their reset condition, and accordingly, the output terminal of the NAND gate 187 is at logic-0. Actuation of either one of the switches 173–174 results in opposite logic states at the input terminals of the NAND gate 187 at the introduction of the pulse to the clock terminals of the flip-flops 183–184. The pulse at the output terminal of the NAND gate 187 is also applied to the holding circuit 196, the holding circuit 196 comprising a capacitor which is charged through a resistor. As is well known, the voltage across the capacitor of the holding circuit 196 builds up gradually in response to the presence of a logic 1 signal at the input terminal of the holding circuit 196. Thus, upon the application of the logic 1 signal by the NAND gate 187, the voltage applied by the holding circuit 196 to the NAND gate 1909 gradually builds up until the push-button 176 is released, whereupon the output voltage of the holding circuit gradually decreases as the capacitor of the holding circuit 196 gradually discharges. Both the flip-flops 183 and 184 provide output pulses of predetermined duration in responses to the appearance of the logic 1 signal at the output terminal of the NAND gate 187.

The output pulse signal of the flip-flop 184 is applied to an input terminal of the NAND gate 190. The output pulse signal of the flip-flop 183 is applied to an input terminal of the holding circuit 195, the holding circuit 195 also comprising a capacitor which is charged through a resistor. In response to the output pulse of the flip-flop 183, the capacitor of the holding circuit 195 gradually alters its voltage; and at the conclusion of the output pulse of the flip-flop 183, the capacitor voltage reverts to its original value. Accordingly, the NAND gate 188 to which the holding circuit 195 is coupled, and the NAND gate 190 to which the holding circuit 196 is coupled provide for an interval of time for the coupling of clock pulses from the oscillator 198 to the counter 200. In the presence of logic-1 signals at the two input terminals of the NAND gate 190, the output signal thereof is complemented by the inverter 192 for enabling the NAND gate 189. Also, a logic 1 signal at the output terminal of the holding circuit 195 enables the NAND gate 188. Thereby, during the common period of enablement of the two NAND gates 188–189, pulses from the oscillator 198 pass through the gates 188–189 to clock the counter 200. The length of time during which the clocking of the counter 200 takes place is variable depending upon the length of time that the logic 1 signal is impressed upon the holding circuit 196 by the NAND gate 187. Thereby, the duration of the clocking interval of the counter 200 is controlled by the length of time during which a person using the synthesizer 20 depresses a push-button 176. Thereby, the person is able to increment or decrement the count of the counter 200 by operation of the switches 174 and 173. The output count of the counter 200 is then applied to the preset terminal of the counter 86 (FIG. 7) to preset the counter 86 to the desired value for presentation of the waveforms on the display of the oscilloscope 24.

By means of the foregoing circuitry, disclosed in the preceding figures, the video synthesizer is able to sample the multiplicity of input signals serially for multiplexing the sampled signals and applying the resultant sequence of samples to an input terminal of the oscilloscope. The sampling rate is adjustable so as to accommodate input signals having a predetermined periodicity. Subsequent tracings of the oscilloscope generate the complete waveform of each of the signals to permit simultaneous viewing of the signals. For non-repetitive waveforms, the input signals are simultaneously sampled and stored in a memory from which they are then outputted via the multiplexing circuit so as to permit their presentation to the oscilloscope via a single terminal, in the case of a single channel oscilloscope, or via two input terminals in the case of a dual-channel oscilloscope. The addressing of the memory is controlled by an address counter which can be clocked at any one of several clocking rates, and which can be preset to a desired count to permit the shifting of the displayed waveforms and a magnification of the displayed waveforms to provide more thorough examination of the waveforms. The multiplexing is accomplished by the insertion of a sequence of voltage levels which displace the respective waveforms from each other along the vertical axis of the oscilloscope. To reduce the effects of input capacitance and cable capacitance at the oscilloscope, as well as to reduce the bandwidth of the multiplexed sequence of signals, the various voltage levels are interlaced so as to minimize the magnitude of jumps between successive ones of the multiplexed levels. The waveforms can be presented concurrently on the oscilloscope, or, if desired, individually under selection of the person utilizing the synthesizer. The control circuitry for the memory includes a generator of a synchronization signal to lock the display to the outputting of data from the memory.

It is to be understood that the above described embodiment of the invention is illustrative only, and that modifications thereof may occur to those skilled in the art. Accordingly, this invention is not to be limited to the embodiment disclosed herein, but is to be limited only as defined by the appended claims.

What is claimed is:

1. A video synthesizer for an oscilloscope comprising:
   a. means for establishing a set of voltage levels, the voltage levels in said set being distributed in groups wherein each group has a maximum voltage level and a minimum voltage level;
   b. means for sequentially combining individual signals of a set of input signals with respective ones of said voltage levels to provide a sequence of combined signals, said combining means including, means for sampling the signals of said set of input signals, and means for substituting a range of said voltage levels in a group for a range of voltage levels in a corresponding sampled input signal;
   c. means for coupling said combined signals to an input terminal of an oscilloscope; and
   d. means for adjusting a repetition frequency of said combining means to be a nonintegral multiple of a repetition frequency of said set of input signals; and wherein
   e. the range of voltage levels in one group is different from the range of voltage levels in each other one of said groups for presenting simultaneously representations of said input signals in a spaced-apart format on said oscilloscope.

2. A system according to claim 1 further comprising:
a. means for simultaneously sampling each of said set of input signals;
b. a memory coupled to said sampling means for storing samples of said sampling; and
c. means for repetitively feeding signals out of said memory into said combining means.

3. A system according to claim 2 further comprising:
a. means for addressing said memory;
b. said addressing means including timing means for establishing a rate for repetitively sampling said set of input signals, and a rate for outputting a sequence of samples of each of said signals of said set of input signals; and wherein
c. said rate of sampling being adjustable for completely reproducing a signal of said set of input signals.

4. A system according to claim 3 wherein said timing means includes means for adjusting the rate of outputting of said signals from said memory to provide for expansion of the display of such signals on said oscilloscope.

5. A system according to claim 4 wherein said addressing means includes means for offsetting the starting point of an output sampling interval of said memory so as to displace a position of a video signal on said oscilloscope along the time axis of said oscilloscope.

6. A system according to claim 1 wherein said combining is accomplished by interlacing said voltage levels to reduce the magnitude of jumps in voltage between successive ones of the voltage levels combined with individual ones of said input signals.

7. A system according to claim 6 wherein said combining means includes groups of switches to be coupled to respective ones of said input signals, said input signals being digital signals having logic states of 1 and 0, there being two switches in each of said groups which are activated respectively by logic states of 1 and 0 to couple corresponding ones of said voltage levels to said input terminal of said oscilloscope, said system further comprising sequencing means for enabling respective ones of said groups in a predetermined sequence to provide said interlacing.

8. In an oscilloscope input signal channel, a video synthesizer adapted for simultaneous connection to a plurality of input signals comprising:
a. means for storing concurrent intervals of said input signals;
b. means for repetively outputting stored input signals from said storing means, each of said signals having logic states 1 and 0;
c. means for sequentially sampling the signals outputted from said storing means to provide samples of said input signals, said sampling means including means for adjusting the relationship between a rate of said outputting and a rate of said sampling to provide a nonintegral-multiple relationship between said two rates; and
d. means coupled to said sampling means for assigning individual values of reference voltages to the logic states 1 and 0 in the samples of respective ones of said input signals, the assigned values of reference voltage being applied to the deflection circuitry of said oscilloscope to identify the input signals from which said samples are taken, said sampling providing for the regeneration of waveforms of said input signals upon the face of said oscilloscope, said waveforms being spaced apart in accordance with said assigned values of reference voltage to permit simultaneous viewing of the regenerated waveforms; and wherein
e. said values of reference voltage are distributed in groups wherein each group has a maximum voltage level and a minimum voltage level, and the range of voltage levels in one group is different from the range of voltage levels in each other one of said groups for presenting simultaneously representations of said input signals in a spaced-apart format on said oscilloscope.

9. A synthesizer according to claim 8 wherein said sampling is accomplished in a staggered fashion to accomplish an interlacing of said values of reference voltages.

10. A synthesizer according to claim 9 wherein said storing means includes switching means and a set of storage elements, said switching means simultaneously coupling said input signals to respective ones of said storage elements for the storing of the concurrent intervals of the input signals.

11. A synthesizer according to claim 10 further comprising clocking means coupled to said storing means and to said outputting means for operating said storing means at a selectable rate for the entry of data into said storing means at a rate adjustable in accordance with the frequency spectrum of said input signals.

12. A synthesizer according to claim 11 wherein said storing means comprises an address counter for addressing said storage elements, and wherein said clocking means includes means for presetting said address counter to displace a waveform along the time axis of said oscilloscope during the outputting of data from said storing means to permit an expansion of the display of the waveform.

13. A synthesizer according to claim 12 wherein said clocking means includes means for gating a sequence of clock pulses at a predetermined clock rate, and means for coupling said sequence of clock pulses to said oscilloscope to generate a mark on the face of the oscilloscope, said gating means being synchronized with said repetitive outputting to provide said mark at the end of a cycle of said repetitive outputting to mark the conclusion of such cycle.

14. A synthesizer according to claim 8 further comprising means for comparing said input signals with a set of reference signals, said comparing means being coupled to said storing means for initiating a storing of said input signals when the logic states of said input signals agree with the logic states of the corresponding ones of said reference signals.

15. A synthesizer according to claim 14 wherein said storing means includes switching means and a set of storage elements, said switching means simultaneously coupling said input signals to respective ones of said storage elements for the storing of the concurrent intervals of the input signals.

16. A synthesizer according to claim 15 wherein said switching means is operable to bypass said storing means for connection of said input signals directly to said sampling means.

17. A synthesizer according to claim 16 wherein said sampling means includes a counter, a means for clocking said counter automatically for addressing successive stages of said sampling means, means for manually advancing the count of said counter to select individual ones of the waveforms of said input signals.

18. A synthesizer according to claim 16 wherein said assigning means comprises a ladder network for providing said values of reference voltages.

19. A synthesizer according to claim 14 wherein said outputting means includes mean for providing a synchronization signal to said oscilloscope.

20. A video synthesizer for connection to the input circuit of an oscilloscope comprising
a. a source of a set of reference voltages, and multiplexing means coupled to said source;
b. said multiplexing means including means for sampling individual ones of a set of input signals;
c. means for sequencing said sampling means to sequentially sample said input signals in a repeating sequence of samples;
d. said multiplexing means applying samples of said input signals sequentially via a terminal of said input circuit to said oscilloscope for regenerating waveforms of said input signals on a display of said oscilloscope; and wherein
e. said multiplexing means includes means for combining samples of individual ones of said input signals with predetermined ones of said reference voltages for offsetting the regenerated waveforms; and wherein
f. values of said set of reference voltages are distributed in groups wherein each group has a maximum voltage level and a minimum voltage level, and the range of voltage levels in one group is different from the range of voltage levels in each other one of said groups for presenting simultaneously representations of said input signals in a spaced-apart format on said oscilloscope.

21. A synthesizer according to claim 20 wherein the order of sampling the input signals in said sample sequence is arranged to minimize the bandwidth of a resulting sequence of combined samples of said combined means.

22. A synthesizer according to claim 21 wherein each of said sample sequences comprises one sample of each of said input signals to provide for the concurrent regeneration of the waveforms of each of said input signals during an x-axis sweep of said oscilloscope.

23. A synthesizer according to claim 22 wherein each of said input signals is periodic, said sequencing means operating said sampling means to provide for a repetition frequency of said sample sequences wherein a repetition frequency of any one of said input signals is a nonintegral multiple of the repetition frequency of said sample sequence.

24. A synthesizer according to claim 22 wherein at least one of said input signals has a nonperiodic waveform, said synthesizer further comprising means coupled to an input terminal of said multiplexing means for storing intervals of said input signals, said storing means including means for reading out stored intervals of the input signals repetitively to said multiplexing means to provide a set of periodic signals to said multiplexing means.

25. A synthesizer according to claim 24 wherein said reading-out means includes means for synchronizing a sweep circuit of said oscilloscope during a selectable point in an output period of said reading out, said synchronizing means including means for selecting said selectable point to accomplish a displacement of said waveforms on the face of said oscilloscope.

26. A synthesizer according to claim 24 wherein said storing means includes means responsive to a preselectable arrangement of logic states among said input signals for intitating the storing of said intervals of input signals.

27. A video synthesizer for connection in the input circuit of an oscilloscope comprising:
a. means for generating a set of reference voltages;
b. means for repetitively sampling consecutive ones of a set of input digital signals to provide sequences of samples of said input signals, there being one sample each of said input signals in each of said sequences, said input signals having voltage levels corresponding to logic states of 1 and 0.
c. means coupled between said generating means and said sampling voltage levels in individual ones of said samples in each of said sequences, there being a one-to-one correspondence among the reference voltages and the voltage levels of the samples to synthesize the waveforms of the input signals on the face of the oscilloscope; and
d. means for driving said sampling means to arrange input signal sampling sequences for minimization of jumps between values of reference voltage substituted by said substituting means; and wherein
e. values of said set of reference voltages are distributed in groups wherein each group has a maximum voltage level and a minimum voltage level, and the range of voltage levels in one group is different from the range of voltage levels in each other one of said groups for presenting simultaneously representations of said input signals in a spaced-apart format on said oscilloscope.

28. A synthesizer according to claim 27 wherein each of said input signals is periodic, said sampling means operating at a repetition frequency which is a nonintegral multiple of any one of the repetition frequencies of said input signals.

29. A synthesizer according to claim 27 wherein at least one of said input signals has a nonperiodic waveform, said synthesizer further comprising means coupled to an input terminal of said sampling means for storing intervals of said input signals, said storing means including means for reading out stored intervals of the input signals repetitively to said sampling means to provide a set of periodic signals to said sampling means.

30. A synthesizer according to claim 29 wherein said reading-out means includes means for synchronizing a sweep circuit of said oscilloscope during a selectable time in an output period of said reading out, said synchronizing means including means for selecting said selectable time to accomplish a displacement of waveforms of said input signals and thereby permit an expansion of the waveforms on the face of the oscilloscope.

31. A synthesizer according to claim 30 wherein said storing means includes means responsive to a preselectable arrangement of logic states among said input signals for initiating the storing of said intervals of input signals.

* * * * *